United States Patent
Lin et al.

(10) Patent No.: US 8,316,718 B2
(45) Date of Patent: *Nov. 27, 2012

(54) MEMS PRESSURE SENSOR DEVICE AND METHOD OF FABRICATING SAME

(75) Inventors: Yizhen Lin, Gilbert, AZ (US); Woo Tae Park, Singapore (SG); Mark E. Schlarmann, Chandler, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 9 days.

This patent is subject to a terminal disclaimer.

(21) Appl. No.: 12/861,435

(22) Filed: Aug. 23, 2010

(65) Prior Publication Data
US 2012/0042731 A1 Feb. 23, 2012

(51) Int. Cl.
*G01L 9/12* (2006.01)
(52) U.S. Cl. .................. 73/718; 73/724; 438/50
(58) Field of Classification Search .................. None
See application file for complete search history.

(56) References Cited

U.S. PATENT DOCUMENTS

| | | | |
|---|---|---|---|
| 5,804,086 | A | 9/1998 | Bruel |
| 6,939,473 | B2 | 9/2005 | Nasiri et al. |
| 2008/0022777 | A1 | 1/2008 | Tan et al. |
| 2009/0154734 | A1 | 6/2009 | Jeong et al. |
| 2009/0154764 | A1 | 6/2009 | Khan et al. |
| 2010/0052082 | A1 * | 3/2010 | Lee et al. ............... 257/416 |
| 2010/0242603 | A1 * | 9/2010 | Miller et al. ............ 73/514.32 |
| 2010/0276765 | A1 * | 11/2010 | Yamamoto et al. ......... 257/415 |
| 2011/0126632 | A1 * | 6/2011 | McNeil et al. ............... 73/718 |
| 2011/0165717 | A1 * | 7/2011 | Lee et al. ................... 438/50 |

FOREIGN PATENT DOCUMENTS

| | | |
|---|---|---|
| WO | 01/78448 A1 | 10/2001 |
| WO | 2008044910 A1 | 4/2008 |

OTHER PUBLICATIONS

Knese et al., Novel Technology for Capacitive Pressure Sensors with Monocrystalline Silicon Membranes, IEEE, 2009, pp. 697-700.

* cited by examiner

*Primary Examiner* — Andre Allen
(74) *Attorney, Agent, or Firm* — Schmeiser, Olsen & Watts LLP

(57) ABSTRACT

A microelectromechanical systems (MEMS) pressure sensor device (20, 62) includes a substrate structure (22, 64) having a cavity (32, 68) formed therein and a substrate structure (24) having a reference element (36) formed therein. A sense element (44) is interposed between the substrate structures (22, 24) and is spaced apart from the reference element (36). The sense element (44) is exposed to an external environment (48) via one of the cavity (68) and a plurality of openings (38) formed in the reference element (36). The sense element (44) is movable relative to the reference element (36) in response to a pressure stimulus (54) from the environment (48). Fabrication methodology (76) entails forming (78) the substrate structure (22, 64) having the cavity (32, 68), fabricating (84) the substrate structure (24) including the sense element (44), coupling (92) the substrate structures, and subsequently forming (96) the reference element (36) in the substrate structure (24).

20 Claims, 5 Drawing Sheets

US 8,316,718 B2

MEMS PRESSURE SENSOR DEVICE AND METHOD OF FABRICATING SAME

RELATED INVENTION

The present invention is related to "MEMS Sensor Device With Multi-stimulus Sensing and Method of Fabricating Same," by Yizhen Lin, Woo Tae Park, Mark E. Schlarmann, and Hemant D. Desai filed on the same date as the present application, which is incorporated by reference herein.

TECHNICAL FIELD OF THE INVENTION

The present invention relates generally to microelectromechanical (MEMS) sensor devices. More specifically, the present invention relates to a method of fabricating a MEMS pressure sensor device.

BACKGROUND OF THE INVENTION

Microelectromechanical systems (MEMS) devices are semiconductor devices with embedded mechanical components. MEMS devices are used in products such as automobile airbag systems, control applications in automobiles, navigation, display systems, inkjet cartridges, and so forth. Capacitive-sensing MEMS device designs are highly desirable for operation in miniaturized devices due to their low temperature sensitivity, small size, and suitability for low cost mass production. One such MEMS device is a pressure sensor that measures pressure, typically of gases or liquids, for control and monitoring in many applications. One pressure sensor configuration uses a diaphragm and a pressure cavity to create a variable capacitor to detect strain (or deflection) due to applied pressure over an area. Common manufacturing technologies use metal, ceramic, and/or silicon diaphragms. Some prior art fabrication techniques yield structures that are undesirably thick and may therefore not function adequately as a movable diaphragm capable of detecting strain due to applied pressure. As such, these structures may have undesirably low sensitivity.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

As the uses for MEMS pressure sensor devices continue to grow and diversify, increasing emphasis is being placed on the development of advanced silicon pressure sensors having enhanced sensitivity. In addition, increasing emphasis is being placed on fabrication methodology for MEMS pressure sensor devices that achieves this enhanced sensitivity without increasing manufacturing cost and complexity and without sacrificing part performance. These efforts are primarily driven by existing and potential high-volume applications in automotive, medical, commercial, and consumer products.

An embodiment of the invention entails a microelectromechanical systems (MEMS) pressure sensor device that uses a diaphragm and a pressure cavity to create a variable capacitor to detect strain (or deflection) due to applied pressure over an area. Fabrication methodology for the MEMS pressure sensor device entails a stacked configuration of two substrate structures with the diaphragm formed as an intervening layer between the two substrate structures. In an embodiment, the pressure sensor includes a buried pressure cavity, also referred to as a reference cavity, fabricated into one of the substrate structures. In another embodiment, a sealed cavity is formed by coupling a cap wafer to one of the substrate structures to form the reference cavity. The fabrication methodology yields a MEMS pressure sensor device with enhanced sensitivity, that is durable, and that can be cost effectively fabricated utilizing existing manufacturing techniques.

Figure 1:
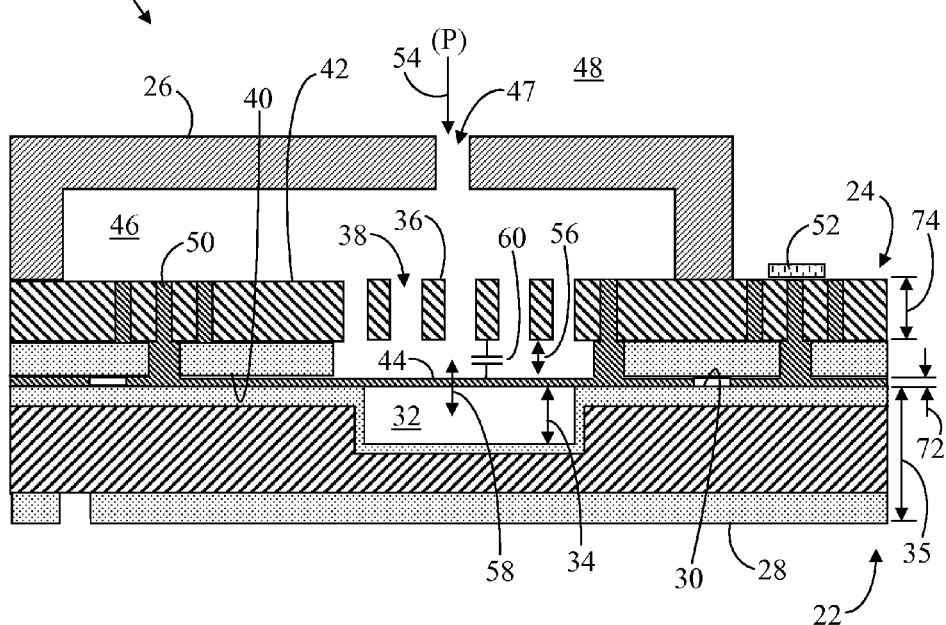
FIG. 1 shows a sectional side view of a microelectromechanical systems (MEMS) pressure sensor device in accordance with an embodiment.

FIG. 1 shows a sectional side view of a microelectromechanical systems (MEMS) pressure sensor device 20 in accordance with an embodiment. FIG. 1 and subsequent FIGS. 2 and 4-10 are illustrated using various shading and/or hatching to distinguish the different elements of MEMS pressure sensor device 20, as will be discussed below. These different elements within the structural layers may be produced utilizing current and upcoming micromachining techniques of depositing, patterning, etching, and so forth.

Pressure sensor device 20 includes a first substrate structure 22, a second substrate structure 24 coupled to first substrate structure 22, and a cap 26 attached to second substrate structure 24. The terms "first" and "second" used herein do not refer to an ordering or prioritization of elements within a countable series of elements. Rather, the terms "first" and "second" are used to distinguish the particular elements for clarity of discussion.

First substrate structure 22 includes a first side 28 and a second side 30. A cavity 32 extends inwardly from second side 30 of first substrate structure 22. In the illustrated embodiment, cavity 32 has a depth 34 that is less than a thickness 35 of first substrate structure 22. Accordingly, cavity 32 does not extend completely through first substrate structure 22.

A reference element 36 is formed in second substrate structure 24 and is aligned with cavity 32. Reference element 36 includes a plurality of openings 38 extending through second substrate structure 24. Second substrate structure 24 further includes a first side 40 and a second side 42. A sense element 44 is disposed on first side 40 of second substrate structure 24, and is aligned with reference element 36. Thus, when first and second substrate structures 22 and 24, respectively, are coupled, sense element 44 is interposed between first and second substrate structures 22 and 24 and sense element 44 is also aligned with cavity 32.

Cap 26 is attached to second side 42 of second substrate structure 24 to form a chamber 46 in which reference element 36 is located. Cap 26 includes a port 47 extending through cap 26 so that sense element 44 is exposed to an environment 48 external to MEMS pressure sensor device 20.

MEMS sensor device 20 may additionally include one or more internal connection sites (not shown), conductive traces (not shown), conductive vias 50, and/or one or more external connection sites 52 (of which one is shown) that may be formed concurrently with other components of MEMS pressure sensor device 20 in accordance with design requirements for device 20.

MEMS pressure sensor device 20 is configured to sense a pressure stimulus (P), represented by an arrow 54, from environment 48 external to MEMS pressure sensor device 20. Sense element 44, referred to hereinafter as a diaphragm 44, is exposed to external environment 48 via port 47 extending through cap 26 and subsequently via openings 38 in reference element 36. Diaphragm 44 is spaced apart from reference element 36 to form a gap 56 between sense element 44 and reference element 36. Diaphragm 44 is capable of movement in a direction 58 that is generally perpendicular to a plane of second substrate structure 24, e.g., first side 40 of second substrate structure 24, in response to pressure stimulus 54.

Pressure sensor device 20 uses diaphragm 44 and the pressure within cavity 32 (typically less than atmospheric pressure) to create a variable capacitor to detect strain due to applied pressure, i.e., pressure stimulus 54. As such, pressure sensor device 20 senses pressure stimulus 54 from environment 48 as movement of diaphragm 44 relative to reference element 36. A change in a capacitance 60 between reference element 36 and diaphragm 44 as a function of pressure stimulus 54 can be registered by sense circuitry (not shown) and converted to an output signal representative of pressure stimulus 54. Reference element 36 of pressure sensor 20 can serve an additional function. That is, reference element 36 overlying diaphragm 44 may function as an over-travel stop that limits movement of diaphragm 44 in direction 58 when MEMS pressure sensor device 20 is subjected to harsh conditions so as to limit or prevent damage to diaphragm 44 and/or to prevent erroneous signals.

Figure 2:
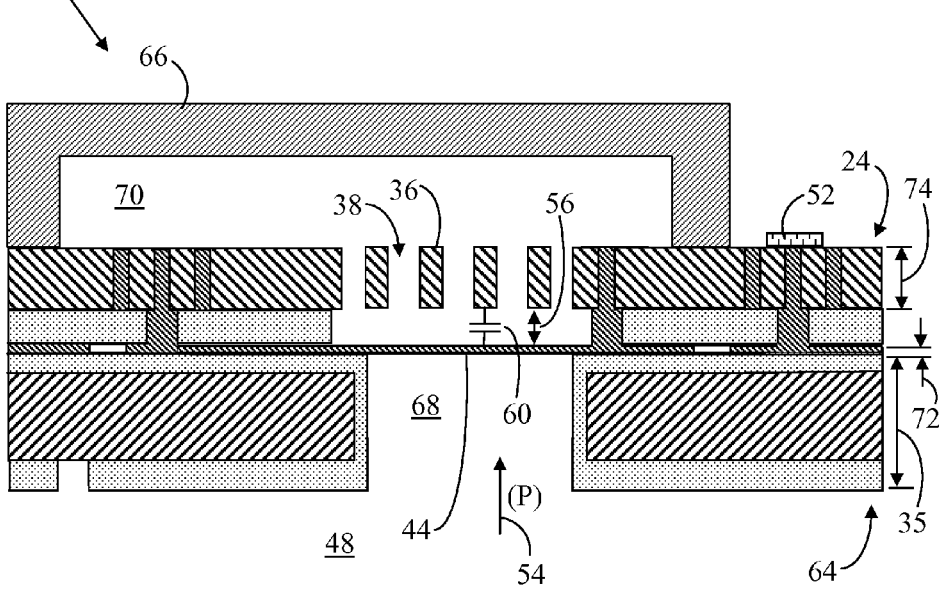
FIG. 2 shows a sectional side view of a MEMS pressure sensor device in accordance with another embodiment.

FIG. 2 shows a sectional side view of a MEMS pressure sensor device 62 in accordance with another embodiment. Pressure sensor device 62 includes a first substrate structure 64, a second substrate structure (i.e., second substrate structure 24) coupled to first substrate structure 64, and a cap 66 attached to second substrate structure 24. First substrate structure 64 of device 62 differs from first substrate structure 22 of device 20 in that first substrate structure 64 has a cavity 68 that extends completely through thickness 35 of first substrate structure 64. However, the same second substrate structure 24 is implemented in each of MEMS sensor devices 20 and 62. Accordingly, a thorough description of second substrate structure 24 need not be repeated in connection with the description of pressure sensor device 62.

Like pressure sensor device 20 (FIG. 1), reference element 36 of pressure sensor device 62 is aligned with cavity 68 of first substrate structure 64, and diaphragm 44 is aligned with reference element 36. Cap 66 is attached to second side 42 of second substrate structure 24 to form a chamber 70 in which reference element 36 is located. In the illustrated embodiment, cap 66 does not include a port. Rather, diaphragm 44 is exposed to external environment 48 via cavity 68, and chamber 70 is a hermetically sealed cavity that serves as the reference pressure cavity at or near vacuum. Thus, diaphragm 44 and chamber 70 function cooperatively to create the variable capacitor for detecting strain due to applied pressure, i.e., pressure stimulus 54.

Referring to FIGS. 1 and 2, fabrication methodology (discussed below) for MEMS pressure sensor devices 20 and 62, yields diaphragm 44 having a thickness 72 that is significantly less than a thickness 74 of reference element 36. In some embodiments, thickness 72 of diaphragm 44 may be less than fifteen percent of thickness 74 of reference element 36. In a more particular embodiment, thickness 72 of diaphragm 44 may be approximately two microns and thickness 74 of reference element 36 may be approximately twenty-five microns. This configuration enables the deflection of diaphragm 44 in response to pressure stimulus 54 relative to reference element 36.

Figure 3:
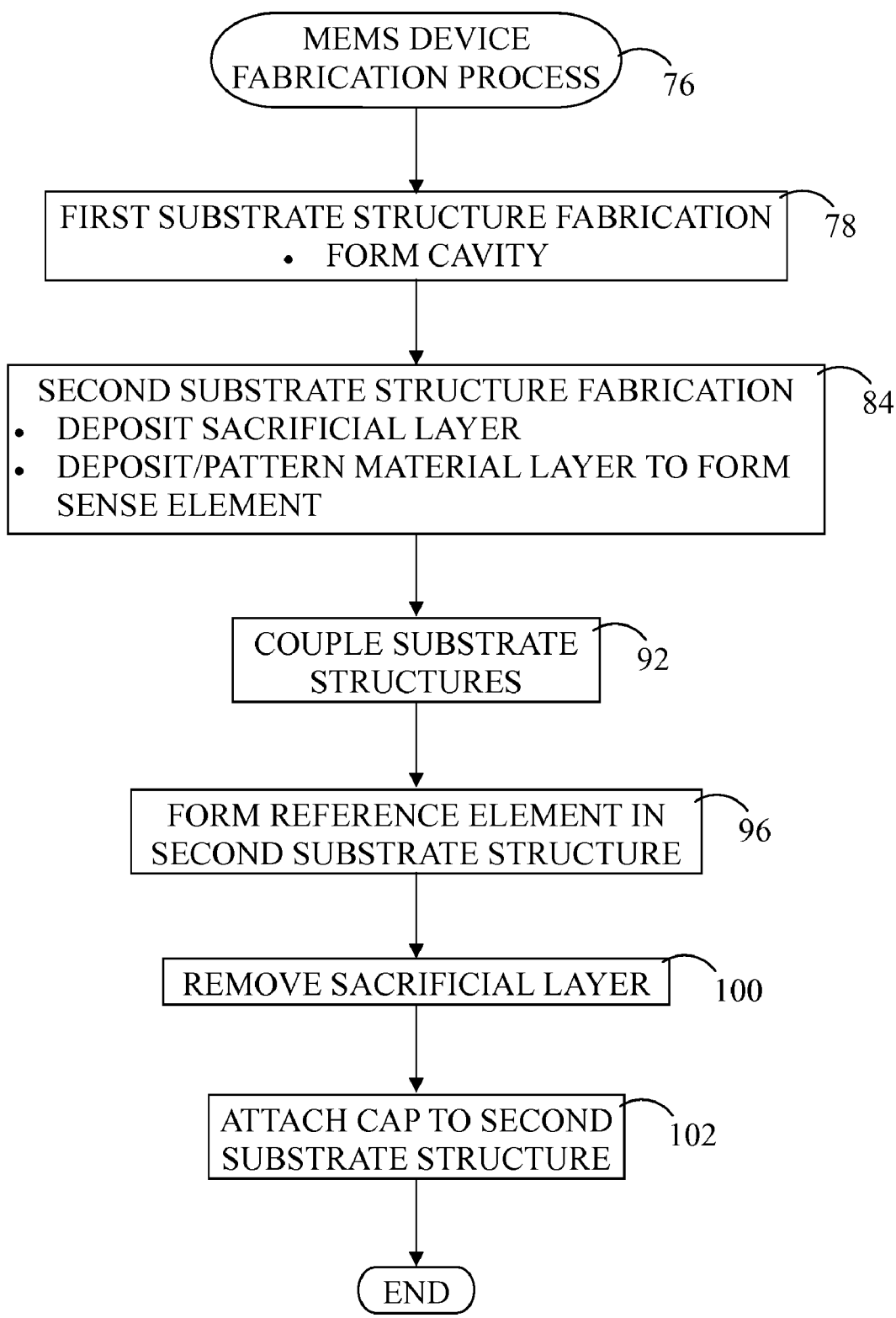
FIG. 3 shows a flowchart of a fabrication process for producing either of the MEMS pressure sensor devices of FIGS. 1 and 2 in accordance with another embodiment.

FIG. 3 shows a flowchart of a fabrication process 76 for producing either of the MEMS pressure sensor devices 20 and 62 (FIGS. 1 and 2) in accordance with another embodiment. Fabrication process 76 implements known and developing MEMS micromachining technologies to cost effectively yield MEMS pressure sensor device 20 or 62 with enhanced pressure sensing sensitivity. Fabrication process 76 is described below in connection with the fabrication of a single MEMS pressure sensor device 20. However, it should be understood by those skilled in the art that the following process allows for concurrent wafer-level manufacturing of a plurality of MEMS pressure sensor devices 20, or alternatively, MEMS pressure sensor devices 62. The individual devices 20 can then be separated, cut, or diced in a conventional manner to provide individual MEMS pressure sensor devices 20 that can be packaged and integrated into an end application.

MEMS sensor device fabrication process 76 begins with an activity 78. At activity 78, fabrication processes related to the formation of first substrate structure 22 are performed.

Figure 4:
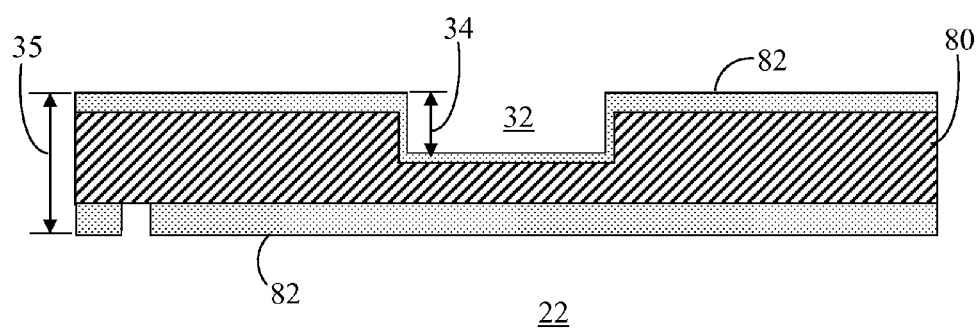
FIG. 4 shows a side sectional view of a substrate structure fabricated in accordance with the process of FIG. 3 for incorporation in the MEMS pressure sensor device of FIG. 1.

Referring to FIG. 4 in connection with activity 78, FIG. 4 shows a side sectional view of first substrate structure 22 fabricated in accordance with process 76 for incorporation in MEMS pressure sensor device 20 (FIG. 1). At activity 78, cavity 32 is formed in a silicon wafer 80, using for example a Deep Reactive Ion Etch (DRIE) technique, a Potassium Hydroxide (KOH) etch technique, or any suitable process, so that the depth of the cavity formed in wafer 80 is less than the thickness of wafer 80. A rightwardly and upwardly directed wide hatch pattern is utilized to represent wafer 80 in the various figures.

Wafer 80 may subsequently be provided with one or more insulating or conductive layers. This layering is exemplified in FIG. 4 by the provision of a blanket insulating layer 82 of, for example, silicon oxide. Insulating layer 82 may be formed on each of first and second sides 28 and 30 and in cavity 32 by performing a local oxidation of silicon (LOCOS) microfabrication process or any other suitable process. A small stipple pattern is utilized to represent insulating layer 82 in the various figures. Other fabrication activities may be performed per convention that are not discussed or illustrated herein for clarity of description. Accordingly, at activity 78, first substrate structure 22 is produced with cavity 32 having depth 34 that is less than the final thickness 35 of first substrate structure 22.

With reference back to FIG. 3, fabrication process 76 continues with an activity 84. At activity 84, fabrication processes related to the formation of second substrate structure 24 are performed.

Figure 5:
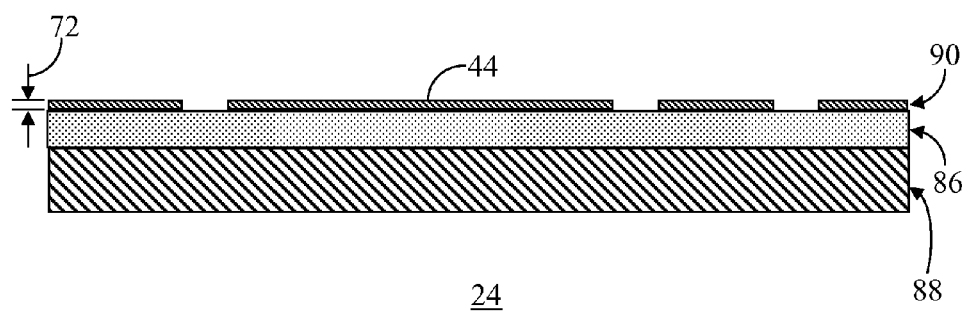
FIG. 5 shows a side sectional view of another substrate structure fabricated in accordance with the process of FIG. 3 for incorporation in the MEMS pressure sensor device of FIG. 1.

Referring now to FIG. 5 in connection with activity 84, FIG. 5 shows a side sectional view of second substrate structure 24 fabricated in accordance with activity 84 of process 76 for incorporation in MEMS pressure sensor device 20 (FIG. 1). Of course, MEMS pressure sensor device 62 (FIG. 2) utilizes the same structure of second substrate structure 24. Thus, second substrate structure 24, fabricated in accordance with process 76, may alternatively be incorporated in MEMS pressure sensor device 62 (FIG. 2).

In accordance with activity 84, fabrication of second substrate structure 24 entails the deposition of an insulating layer, referred to herein as a sacrificial layer 86, for example, silicon oxide, phosphosilicate glass (PSG), and the like on a wafer 88. A rightwardly and downwardly directed wide hatch pattern is utilized to represent wafer 88 in the various figures, and a small stipple pattern is again utilized to represent sacrificial layer 86 in the various figures.

Next, a material layer 90 is formed over sacrificial layer 86 by, for example, chemical vapor deposition, physical vapor deposition, or any other suitable process. Material layer 90 may then be selectively patterned and etched to form at least diaphragm 44 of MEMS pressure sensor device 20 (FIG. 1). Material layer 90 may be, for example, polycrystalline silicon also referred to as polysilicon or simply poly, although other suitable materials may alternatively be utilized to form material layer 90. Material layer 90 may additionally be thinned and polished by performing, for example, Chemical-Mechanical Planarization (CMP) or another suitable process to yield diaphragm 44 having thickness 72 of, for example, two microns. A rightwardly and downwardly directed narrow hatch pattern is utilized to represent material layer 90 in the various figures.

With reference back to FIG. 3, following fabrication activities 78 and 84, MEMS device fabrication process 76 continues with an activity 92. At activity 92, second substrate structure 24 (FIG. 5) is coupled with first substrate structure 22 (FIG. 4).

Figure 6:
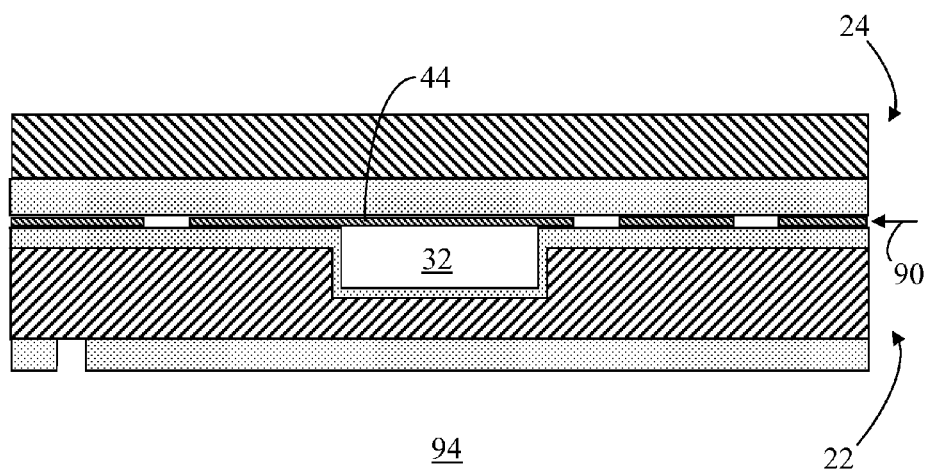
FIG. 6 shows a side sectional view of the substrate structures of FIGS. 4 and 5 coupled together in a subsequent stage of processing.

Referring now to FIG. 6 in connection with activity 92, FIG. 6 shows a side sectional view of first and second substrate structures 22 and 24 coupled in a subsequent stage 94 of processing. In an embodiment, first and second substrate structures 22 and 24 are bonded together using, for example, a silicon direct bonding technique under vacuum. In an embodiment, the pressure inside the wafer bonder when coupling first and second substrate structures 22 and 24 can be controlled by a mechanical pump so that a defined, i.e., predetermined, cavity pressure is produced inside of cavity 32. Thus, once bonded, sense element 44 is interposed between first and second substrate structures 22 and 24, respectively, and cavity 32 is formed as a buried cavity with evacuated pressure. That is, a pressure within cavity 32 is significantly less than ambient or atmospheric pressure.

With reference back to FIG. 3, following coupling activity 92, MEMS device fabrication process 76 continues with an activity 96. At activity 96, reference element 36 (FIG. 1) is formed in second substrate structure 24.

Figure 7:
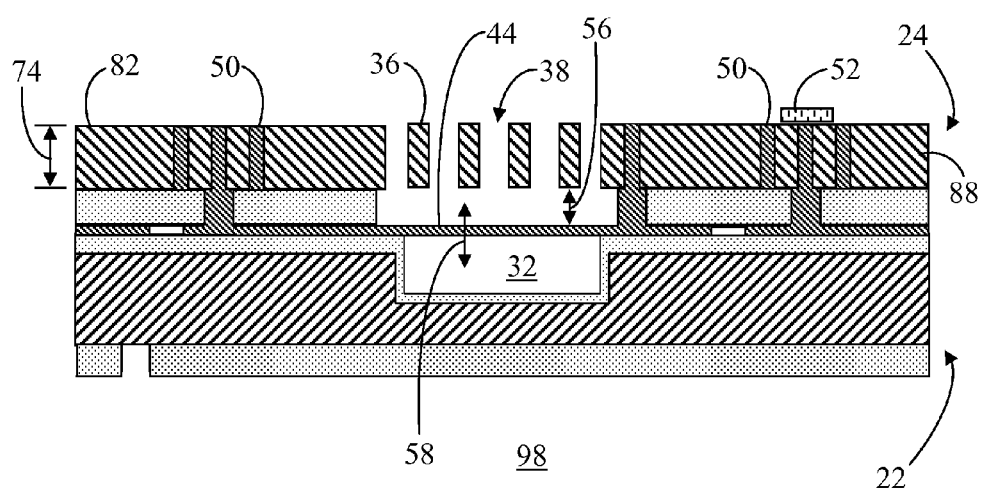
FIG. 7 shows a side sectional view of the structure of FIG. 6 in a subsequent stage of processing.

Referring to FIG. 7 in connection with activity 96, FIG. 7 shows a side sectional view of the structure of FIG. 6 in a subsequent stage 98 of processing. In an embodiment, activity 96 entails polishing or otherwise planarizing second side 42 of second substrate structure 24 to a final thickness 74 of, for example, approximately twenty-five microns. Wafer 88 of second substrate structure 24 is patterned by, for example, DRIE or KOH etching, so that openings 38 are created in reference element 36 overlying diaphragm 44 and cavity 32. In the illustrated embodiment, openings 38 in reference element 36 serve as pressure vent holes so that diaphragm 44 is exposed to environment 48 (FIG. 1), with or without cap 26 (FIG. 1), for detection of pressure stimulus 54 (FIG. 1). Other processes that may be associated with activity 96 can include patterning, etching, and deposition of the appropriate materials to form conductive vias 50, external connection sites 52, internal connection sites (not shown), conductive traces (not shown) in accordance with design requirements for device 20.

With reference back to FIG. 3, following activity 96, MEMS sensor device fabrication process 76 continues with an activity 100. At activity 100, sacrificial layer 86 underlying reference element 36 is removed.

Again referring to FIG. 7, at stage 98 of processing, sacrificial layer 86 has been removed between reference element 36 and diaphragm 44 so that gap 56 is formed between reference element 36 and diaphragm 44. Openings 38 in reference element 36 enable passage of an etch material, or etchant, in order to remove the underlying sacrificial layer 86 at activity 100. In an embodiment, the etching of sacrificial layer 86 at activity 100 removes substantially an entirety of sacrificial layer 86 between reference element 36 and diaphragm 44 so that reference element 36 and diaphragm 44 are spaced apart from one another by gap 56. With the removal of sacrificial layer 86 at activity 100, diaphragm 44 is free to move in response to external pressure stimulus 54 (FIG. 1) in direction 58.

With reference back to FIG. 3, following activity 100, MEMS device fabrication process 76 continues with an activity 102. At activity 102, cap 26 (FIG. 1) having port 47 (FIG. 1) may be attached to second side 42 of second substrate structure 24. Attachment of cap 26 to second substrate structure 24 may be accomplished using, for example, glass frit bonding, metal eutectic bonding, and the like.

Process 76 may continue with other conventional fabrication activities (not shown). These additional fabrication activities may include packaging, forming electrical interconnects, testing, separation, and so forth. Following fabrication of MEMS pressure sensor device 20 (FIG. 1), fabrication process 76 ends with a buried cavity 32 and a thin, highly sensitive diaphragm 44 having been formed using existing, cost effective, MEMS fabrication operations and using a wafer bonding technique.

Figure 8:
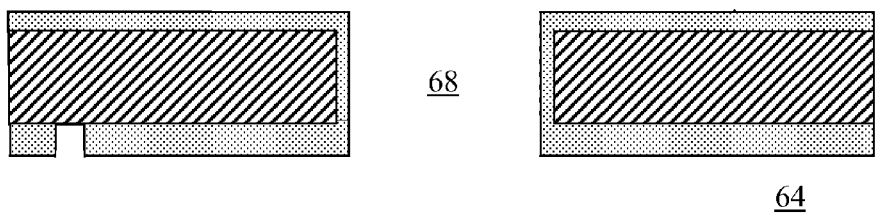
FIG. 8 shows a side sectional view of a substrate structure fabricated in accordance with the process of FIG. 3 for incorporation in the MEMS pressure sensor device of FIG. 2.
Figure 9:
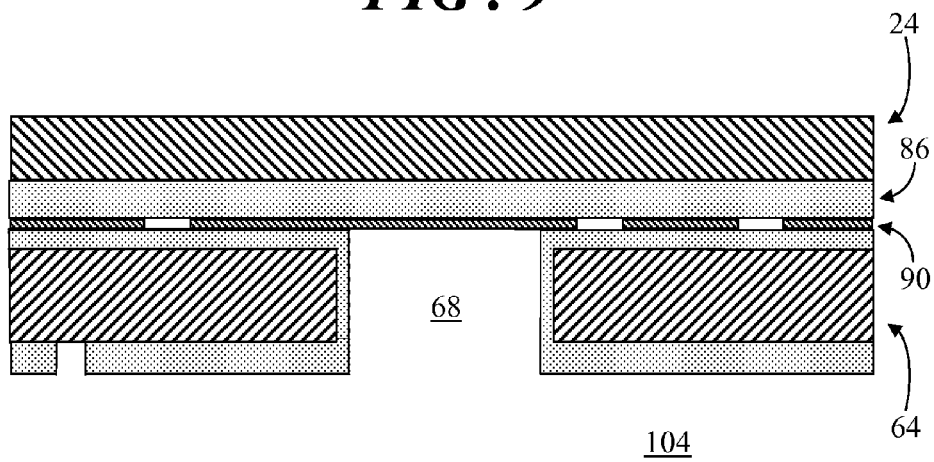
FIG. 9 shows a side sectional view of the substrate structures of FIGS. 5 and 8 coupled together in a subsequent stage of processing.
Figure 10:
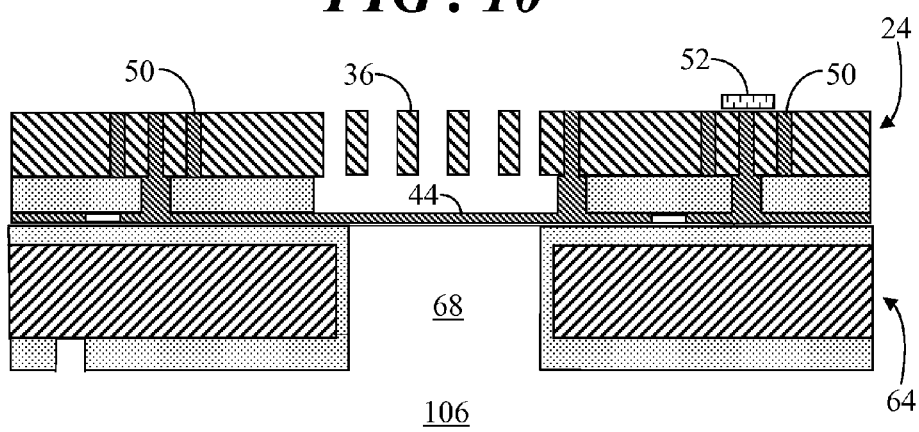
FIG. 10 shows a side sectional view of the structure of FIG. 9 in a subsequent stage of processing.

Referring to FIGS. 8-10, FIG. 8 shows a side sectional view of first substrate structure 64 fabricated in accordance with MEMS device fabrication process 76 (FIG. 3) for incorporation in MEMS pressure sensor device 62 (FIG. 2). FIG. 9 shows a side sectional view of first substrate structure 64 and second substrate structure 24 coupled in a subsequent stage 104 of processing. FIG. 10 shows a side sectional view of the structure of FIG. 9 in a subsequent stage 106 of processing.

FIGS. 8-10 are presented herein to demonstrate the implementation of MEMS device fabrication process 76 (FIG. 3) to fabricate MEMS pressure sensor device 62. In particular, in this embodiment, cavity 68 is fabricated to extend through an entirety of first substrate structure 64. However, the remaining operations of fabricating second substrate structure 24 at activity 84 (FIG. 3), coupling first and second substrate structures 64 and 24 at activity 92 (FIG. 3), forming reference element 36 in second substrate structure 24 at activity 96 (FIG. 3), removing sacrificial layer 86 at activity 100 (FIG. 3), and attaching cap 66 (FIG. 2) to second substrate structure 24 at activity 102 (FIG. 3) remain largely unchanged.

Again, following fabrication of MEMS pressure sensor device 62 (FIG. 2), fabrication process 76 ends having cost effectively produced device 62 having a thin, highly sensitive diaphragm 44, cavity 68 functioning as a pressure port, and cap 66 being used to form a sealed cavity 70 (FIG. 2). Moreover, MEMS pressure sensor device 62 has also been formed using existing, cost effective MEMS fabrication operations and using a wafer bonding technique.

Embodiments described herein comprise compact MEMS pressure sensor devices that use a diaphragm and a pressure cavity to create a variable capacitor to detect strain (or deflection) due to applied pressure over an area. Fabrication methodology for the MEMS pressure sensor devices entails a stacked configuration of two substrate structures with the diaphragm formed as an intervening layer between the two substrate structures. In an embodiment, the MEMS pressure sensor device includes a buried reference cavity fabricated into one of the substrate structures. In another embodiment, a sealed cavity is formed by coupling a cap wafer to one of the substrate structures to form the reference cavity. The fabrication methodology results in a thin diaphragm for enhanced sensitivity to a pressure stimulus, the efficient production of a hermetically sealed reference pressure chamber, and implementation of low cost existing MEMS batch processing techniques. In addition, the MEMS pressure sensor device and fabrication methodology achieves the additional advantages of good performance, small size, and low power consumption.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of producing a microelectromechanical systems (MEMS) sensor device comprising:
   forming a first substrate structure having a cavity;
   forming a sense element from a material layer of a second substrate structure;
   coupling said second substrate structure with said first substrate structure such that said sense element is interposed between said first and second substrate structures and is aligned with said cavity; and
   forming a reference element in said second substrate structure aligned with said sense element, said reference element including a plurality of openings extending through said second substrate structure, wherein said sense element is exposed to an environment external to said MEMS sensor device via one of said cavity and said plurality of openings.

2. A method as claimed in claim 1 wherein:
   said forming said sense element comprises depositing a sacrificial layer on a surface of a wafer substrate and depositing said material layer on said sacrificial layer; and
   said method further comprises removing said sacrificial layer between said reference element and said sense element via said plurality of openings in said reference element following said coupling operation, said removing operation producing a gap between said reference element and said sense element.

3. A method as claimed in claim 1 wherein said forming said sense element includes producing said sense element having a first thickness that is less than a second thickness of said reference element.

4. A method as claimed in claim 3 wherein said first thickness of said sense element is less than fifteen percent of said second thickness of said reference element.

5. A method as claimed in claim 1 wherein said forming said first substrate structure produces said cavity having a depth that is less than a thickness of said first substrate structure, and said sense element is exposed to said environment via said plurality of openings.

6. A method as claimed in claim 5 wherein said coupling operation comprises controlling a cavity pressure of said cavity such that said cavity pressure is less than atmospheric pressure.

7. A method as claimed in claim 6 wherein said material layer is deposited on a first side of said second substrate structure, and said method further comprises attaching a cap to a second side of said second substrate structure to form a chamber in which said reference element is located; and
   providing a port extending through said cap so that said sense element is exposed to said environment via said port.

8. A method as claimed in claim 1 wherein said forming said first substrate structure produces said cavity through a thickness of said first substrate structure, and said sense element is exposed to said environment via said cavity.

9. A method as claimed in claim 8 wherein said material layer is deposited on a first side of said second substrate structure, and said method further comprises attaching a cap to a second side of said second substrate structure to form a hermetically sealed chamber in which said reference element is located.

10. A method as claimed in claim 1 wherein said MEMS sensor device is a pressure sensor, and said sense element is a diaphragm that is movable relative to said reference element in response to a pressure stimulus from said environment, and said forming said sense element comprises forming said diaphragm from polycrystalline silicon.

11. A microelectromechanical systems (MEMS) sensor device comprising;
   a first substrate structure having a cavity formed therein; and
   a second substrate structure having a reference element formed in said second substrate structure and aligned with said cavity, said reference element including a plurality of openings extending through said second substrate structure;
   a sense element disposed on a first side of said second substrate structure and aligned with said reference element, said sense element being spaced apart from said reference element to form a gap between said sense element and said reference element, said sense element being exposed to an environment external to said MEMS sensor device via one of said cavity and said plurality of openings, and said sense element being movable relative to said reference element in response to a pressure stimulus from said environment.

12. A MEMS sensor device as claimed in claim 11 wherein said sense element exhibits a first thickness that is less than a second thickness of said reference element.

13. A MEMS sensor device as claimed in claim 12 wherein said first thickness is less than fifteen percent of said second thickness of said reference element.

14. A MEMS sensor device as claimed in claim 11 wherein said cavity has a depth that is less than a thickness of said first substrate structure, and said sense element is exposed to said environment via said plurality of openings.

15. A MEMS sensor device as claimed in claim 14 further comprising a cap attached to a second side of said second substrate structure to form a chamber in which said reference element is located, said cap including a port extending through said cap so that said sense element is exposed to said environment via said port.

16. A MEMS sensor device as claimed in claim 11 wherein said cavity extends through a thickness of said first substrate structure, said sense element being exposed to said environment via said cavity, and said MEMS sensor device further comprises a cap attached to a second side of said second substrate structure to form a hermetically sealed chamber in which said reference element is located.

17. A MEMS sensor device as claimed in claim 11 wherein said sense element and said reference element form a capacitive pressure sensor.

18. A method of producing a microelectromechanical systems (MEMS) sensor device comprising:
    forming a first substrate structure including a cavity;
    forming a sense element from a material layer on a first side of a second substrate structure, said forming said sense element including depositing a sacrificial layer on a wafer substrate and depositing said material layer on said sacrificial layer;
    coupling said second substrate structure with said first substrate structure such that said sense element is interposed between said first and second substrate structures and is aligned with said cavity;
    forming a reference element in said second substrate structure aligned with said sense element, said reference element including a plurality of openings extending through said second substrate;
    removing said sacrificial layer between said reference element and said sense element via said plurality of openings in said reference element following said coupling operation, said removing operation producing a gap between said reference element and said sense element; and
    attaching a cap to a second side of said second substrate structure to form a chamber in which said reference element is located, wherein said sense element is exposed to an environment external to said MEMS sensor device via one of said cavity and said plurality of openings, and said sense element is movable relative to said reference element in response to a pressure stimulus from said environment.

19. A method as claimed in claim 18 wherein:
    said forming said first substrate structure produces said cavity having a depth that is less than a thickness of said first substrate structure; and
    providing a port extending through said cap so that said sense element is exposed to said environment via said port.

20. A method as claimed in claim 18 wherein:
    said forming said first substrate structure produces said cavity through a thickness of said first substrate structure, said sense element being exposed to said environment via said cavity; and
    said coupling said cap forms a hermetically sealed chamber bounded by said cap and said sense element in which said reference element is located.

* * * * *